(12) United States Patent
Pendharkar et al.

(10) Patent No.: US 7,414,287 B2
(45) Date of Patent: Aug. 19, 2008

(54) SYSTEM AND METHOD FOR MAKING A LDMOS DEVICE WITH ELECTROSTATIC DISCHARGE PROTECTION

(75) Inventors: Sameer P. Pendharkar, Allen, TX (US); Jonathan S. Brodsky, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/063,312

(22) Filed: Feb. 21, 2005

(65) Prior Publication Data

US 2006/0186467 A1 Aug. 24, 2006

(51) Int. Cl.
*H01L 29/94* (2006.01)

(52) U.S. Cl. .................. 257/341; 257/343; 257/355; 257/E29.256; 257/E29.258

(58) Field of Classification Search .......... 257/328, 257/341, 343, 355, E29.256, E29.258
See application file for complete search history.

(56) References Cited

U.S. PATENT DOCUMENTS

| 5,736,766 | A | | 4/1998 | Efland et al. | |
| 6,137,140 | A | * | 10/2000 | Efland et al. | 257/343 |
| 6,144,070 | A | * | 11/2000 | Devore et al. | 257/343 |
| 6,614,077 | B2 | * | 9/2003 | Nakamura et al. | 257/355 |
| 7,027,277 | B1 | * | 4/2006 | Vashchenko et al. | 361/56 |
| 2002/0030238 | A1 | * | 3/2002 | Nakamura et al. | 257/409 |
| 2005/0162140 | A1 | * | 7/2005 | Hirst | 323/273 |
| 2005/0179087 | A1 | * | 8/2005 | Lin et al. | 257/356 |
| 2006/0043487 | A1 | * | 3/2006 | Pauletti et al. | 257/355 |
| 2006/0145260 | A1 | * | 7/2006 | Kim | 257/355 |

OTHER PUBLICATIONS

S.M. Sze, "Thyristors" from Physics of Semiconductor Devices (second edition), 1981, John Wiley and Sons, pp. 191-193.*
Lee et al., "Novel ESD Protection Structure with Embedded SCR LDMOS for Smart Power Technology," from 2002 IEEE International Reliability Physics Symposium Proceedings on Apr. 7-11, 2002, pp. 156-161. (IEEE Catalog No. 02CH37320).*
S.M. Sze, "Thyristors" from Physics of Semiconductor Devices (second edition), 1981, John Wiley and Sons, pp. 191-193.*

* cited by examiner

*Primary Examiner*—Matthew E Warren
(74) *Attorney, Agent, or Firm*—Frederick J. Telecky, Jr.; Wade J. Brady, III

(57) ABSTRACT

A semiconductor device includes one or more LDMOS transistors and one of more SCR-LDMOS transistors. Each LDMOS transistor includes a LDMOS well of a first conductivity type, a LDMOS source region of a second conductivity type formed in the LDMOS well, and a LDMOS drain region of a second conductivity type separated from the LDMOS well by a LDMOS drift region of the second conductivity type. Each SCR-LDMOS transistor comprising a SCR-LDMOS well of the first conductivity type, a SCR-LDMOS source region of the second conductivity type formed in the SCR-LDMOS well, a SCR-LDMOS drain region of a second conductivity type, and a anode region of the first conductivity type between the SCR-LDMOS drain region and the SCR-LDMOS drift region. The anode region is separated from the SCR-LDMOS well by a SCR-LDMOS drift region of the second conductivity type.

6 Claims, 4 Drawing Sheets

SYSTEM AND METHOD FOR MAKING A LDMOS DEVICE WITH ELECTROSTATIC DISCHARGE PROTECTION

TECHNICAL FIELD OF THE INVENTION

This invention relates generally to the field of semiconductor devices and, more specifically, to a system and method for making a lateral double-diffused metal oxide semiconductor (LDMOS) device with electrostatic discharge (ESD) protection.

BACKGROUND OF THE INVENTION

A double-diffused metal oxide semiconductor (DMOS) device is characterized by a source region and a backgate region, which are diffused at the same time. The transistor channel is formed by the difference in the two diffusions, rather than by separate implantation. DMOS devices have the advantage of decreasing the length of the channel, thereby providing low-power dissipation and high-speed capability.

DMOS devices may have either lateral or vertical configurations. A DMOS device having a lateral configuration (referred to herein as an LDMOS), has its source and drain at the surface of the semiconductor wafer. Thus, the current flow is lateral.

In general, desired characteristics of an LDMOS are a high breakdown voltage and a low specific on-resistance. For many applications, it would also be desirable to have an LDMOS that provides electrostatic discharge (ESD) protection. Examples of such applications are print head drivers for printers and electronic braking systems for automobiles.

Existing approaches to ESD protection for LDMOS devices are based on the addition of a protection device to the LDMOS circuit. The protection device is often larger than the LDMOS device being protected.

SUMMARY OF THE INVENTION

In accordance with the present invention, a system and method a for making a LDMOS device with electrostatic discharge (ESD) protection is provided that substantially eliminates or reduces disadvantages or problems associated with previously developed systems and methods.

In one embodiment, a semiconductor device includes one or more SCR-LDMOS transistors and one of more LDMOS transistors.

In another embodiment, a semiconductor device includes one or more LDMOS transistors and one of more SCR-LDMOS transistors. Each LDMOS transistor includes a LDMOS well of a first conductivity type, a LDMOS source region of a second conductivity type formed in the LDMOS well, and a LDMOS drain region of a second conductivity type separated from the LDMOS well by a LDMOS drift region of the second conductivity type. Each SCR-LDMOS transistor comprising a SCR-LDMOS well of the first conductivity type, a SCR-LDMOS source region of the second conductivity type formed in the SCR-LDMOS well, a SCR-LDMOS drain region of a second conductivity type, and a anode region of the first conductivity type between the SCR-LDMOS drain region and the SCR-LDMOS drift region. The anode region is separated from the SCR-LDMOS well by a SCR-LDMOS drift region of the second conductivity type.

In another embodiment of the invention, a semiconductor device includes a plurality of SCR-LDMOS transistors and a plurality of LDMOS transistors. Each SCR-LDMOS transistor includes a SCR-LDMOS semiconductor layer of a first conductivity type. A second SCR-LDMOS region of a second conductivity type opposite the first conductivity type is formed in the SCR-LDMOS semiconductor layer. A third SCR-LDMOS region of the first conductivity type is formed as a well in the second SCR-LDMOS region, and a SCR-LDMOS source region of the second conductivity type is formed in the third SCR-LDMOS region. A SCR-LDMOS drain region of the second conductivity type is formed in the second SCR-LDMOS region and spaced apart from the SCR-LDMOS source region, such that a SCR-LDMOS channel is formed between the SCR-LDMOS source region and the SCR-LDMOS drain region. A SCR-LDMOS backgate region is formed in the third SCR-LDMOS region and adjacent the SCR-LDMOS source region such that the SCR-LDMOS source region separates the SCR-LDMOS backgate region and the SCR-LDMOS channel. The SCR-LDMOS backgate region is of the first conductivity type. Each SCR-LDMOS transistor also includes a SCR-LDMOS anode region of the first conductivity type between the SCR-LDMOS drain region and the SCR-LDMOS channel region. Each SCR-LDMOS transistor also includes a SCR-LDMOS gate oxide layer over the SCR-LDMOS channel and a SCR-LDMOS gate over at least part of the SCR-LDMOS source region and the SCR-LDMOS channel.

In this embodiment, each LDMOS transistor includes a LDMOS semiconductor layer having a first LDMOS region of the first conductivity type. The LDMOS first region has a first dopant concentration. A pair of second LDMOS regions of the first conductivity type first is formed at a face of the LDMOS semiconductor layer in the first LDMOS region. The LDMOS second regions have a second dopant concentration greater than the first dopant concentration. A pair LDMOS drain regions of the first conductivity type are formed at a face of the LDMOS semiconductor layer in the second LDMOS regions. The LDMOS drain regions have a third dopant concentration greater than said second dopant concentration. A third LDMOS region of the second conductivity type opposite the first conductivity type is formed at a face of the LDMOS semiconductor layer in the first LDMOS region. The third LDMOS region is formed between the pair of second LDMOS regions. A LDMOS source region of the first conductivity type is formed at a face of the LDMOS semiconductor layer in the third LDMOS region, and a pair of LDMOS channel regions is defined in the third LDMOS region between an edge of each of the pair of LDMOS source regions and an associated edge of the third LDMOS region. A LDMOS gate extends over the pair of LDMOS channel regions.

The present invention provides a number of important technical advantages. Previous techniques involved converting an entire semiconductor device from LDMOS transistors to SCR-LDMOS transistors, which required that the device size be increased by almost 20% to maintain the required self-protection capability. The present invention provides ESD protection by converting only a portion of the semiconductor device from LDMOS transisting to SCR-LDMOS transisting, which reduces the device size relative to these previous technique. Using the present invention, the device size does not have to be increased significantly (typically about 1-2%) from the standard LDMOS embodiments to obtain the self-protecting capability. For these and other readily apparent reasons, the present invention represents a significant advance over prior art systems and methods.

BRIEF DESCRIPTION OF THE DRAWINGS

To provide a more complete understanding of the present invention, and for further features and advantages thereof, reference is now made to the following description taken in conjunction with the accompanying drawings, in which.

DETAILED DESCRIPTION OF THE DRAWINGS

FIGS. 1-8 illustrate a cross-section of a LDMOS transistor 10 at successive stages during fabrication.

Figure 1:
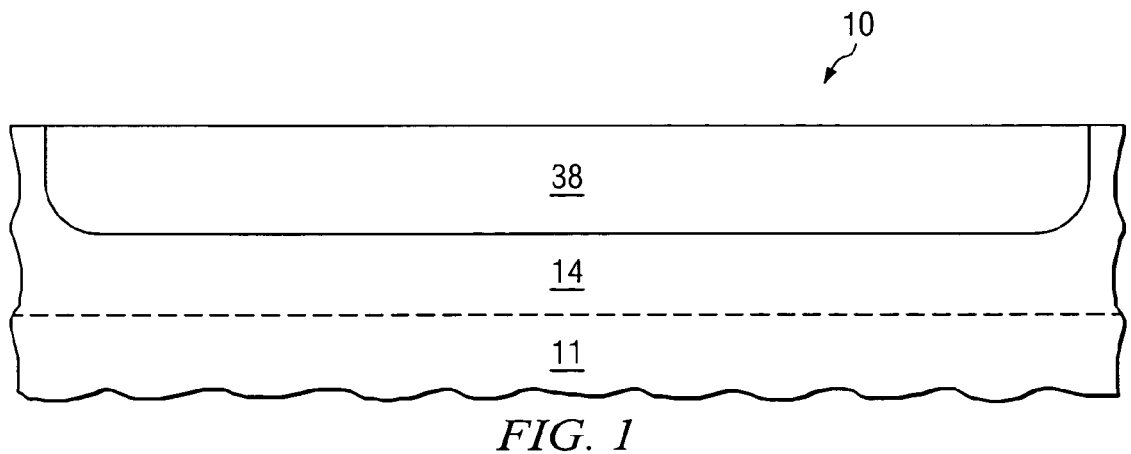
FIGS. 1-8 illustrate cross-sections of a LDMOS transistor at successive stages during fabrication.

As shown in FIG. 1, fabrication of LDMOS transistor 10 initially begins with the formation of p-epitaxial layer 14 on p+ substrate 11 which has a resistivity of about 0.015 Ω-cm. An oxide layer (not shown) is then formed over p-epitaxial layer 14. A nitride layer (not shown) is formed over the oxide layer and patterned and etched using high voltage N-well mask to open a window exposing area at the surface of epitaxial layer 14. An n type dopant, such as phosphorous with a dose of about 4.0E12 atoms/cm$^2$ at an energy of about 80 KeV, is then implanted through the window into the exposed area of p-epitaxial layer 14 to form high voltage N-well 38. The oxide and nitride layers are then removed, using a plasma etch, for example. A drive-in step is then performed to diffuse high voltage N-well 38 resulting in the structure of LDMOS transistor 10 illustrated in FIG. 1. N-well 38 is a low concentration (n−), deep diffusion well.

Figure 2:
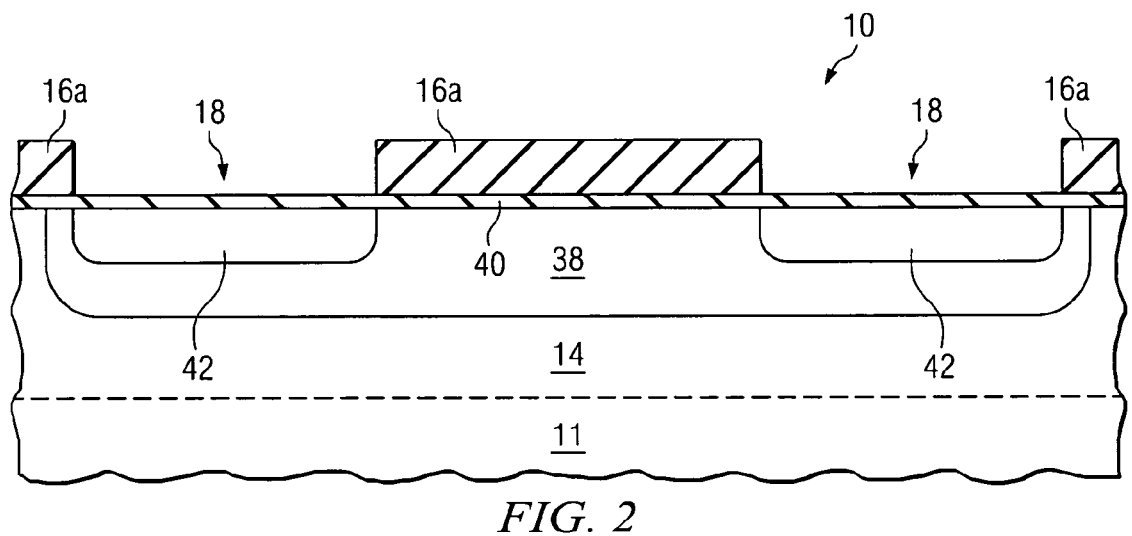

As shown in FIG. 2, an oxide layer 40 is then deposited or grown over the surface of epitaxial layer 14. A layer of photoresist 16a is deposited over oxide layer 40 and patterned and etched using a low voltage N-well mask to expose areas 18 at the face of N-well 38. An n type dopant, such as phosphorous with a dose of about 8.0E12 atoms/cm$^2$ at an energy of about 80 KeV, is then implanted in areas 18 in N-well 38 to form low voltage N-wells 42, resulting in the structure of LDMOS transistor 10 illustrated in FIG. 2.

Figure 3:
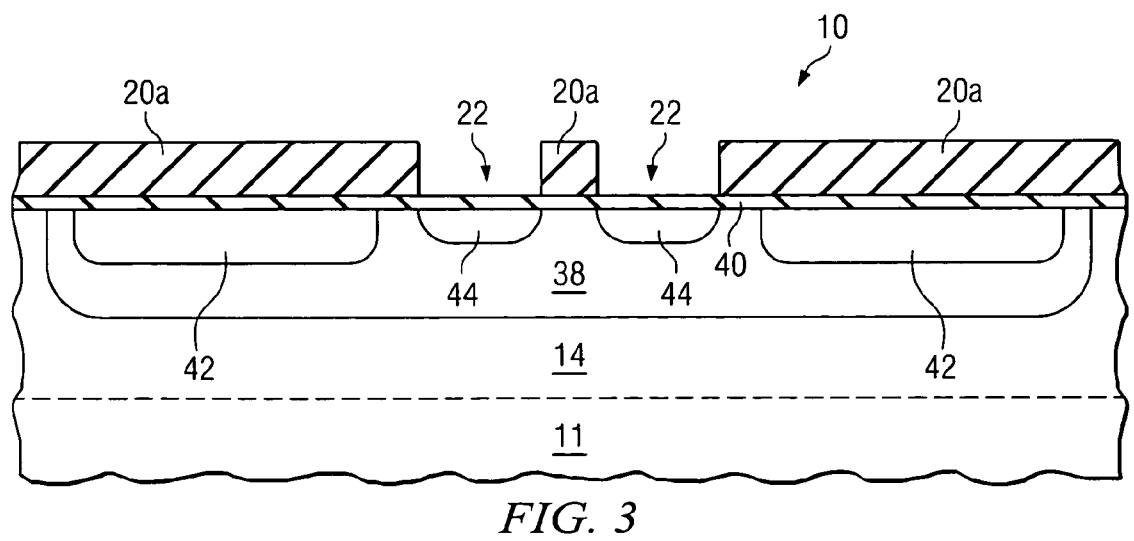

As shown in FIG. 3, photoresist layer 16a is then removed, using a wet etch, for example, and a layer of photoresist 20a deposited over oxide layer 40 and patterned and etched using a P-well mask to expose area 22 at the face of N-well 38. Implants of p and n type dopants, with the n type dopant having substantially less diffusivity than the p type dopant, are performed in area 22 resulting in the structure of LDMOS transistor 10 illustrated in FIG. 3. A suitable p type dopant is boron with a dose of about 6.7E13 atoms/cm$^2$ at an energy of about 100 KeV. A suitable n type dopant is arsenic with a dose of about 1.0E14 atoms/cm$^2$ at an energy of about 120 KeV.

Figure 4:
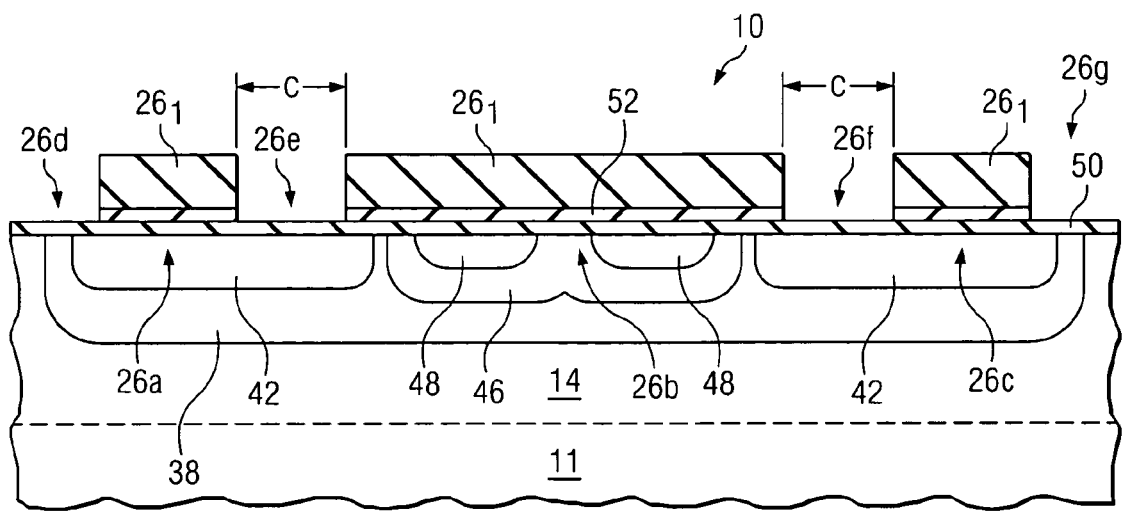

As shown in FIG. 4, photoresist layer 20a is then removed, using a wet etch for example. A drive-in step, for example 80 minutes at 1100 degrees Centigrade, is performed to diffuse the n and p type implants in P-well 44 with the result that the deeper p type implant forms the P-well backgate/channel region 46 while the shallower n type implants form n type source regions 48. The drive-in step also drives low voltage N-wells 42 deeper into N-well 38 as shown in the structure of LDMOS transistor 10 illustrated in FIG. 4. Oxide layer 40 is then removed. A pad oxide layer 50 having a thickness of about 400 Angstroms is formed over the surface of p epitaxial layer 14 and N-well 38. An LPCVD nitride layer 52 having a thickness of about 1400 Angstroms is formed over pad oxide layer 50. A layer of photoresist 26$_1$ is deposited over nitride layer 52 and patterned and etched using a mask. Nitride layer 52 is then patterned and etched using photoresist layer 26$_1$ as a mask to cover regions 26a-26c and expose regions 26d-26g at the surface of N-well 38 and epitaxial layer 14 resulting in the structure of LDMOS transistory 10 illustrated in FIG. 4. In a particular embodiment, the width c of the openings in nitride layer 52 exposing regions 26e and 26f is selected to be very narrow, preferably as small as the photolithography will allow. For a 1.04 micron process, width c is preferably also 1.04 microns.

Figure 5:
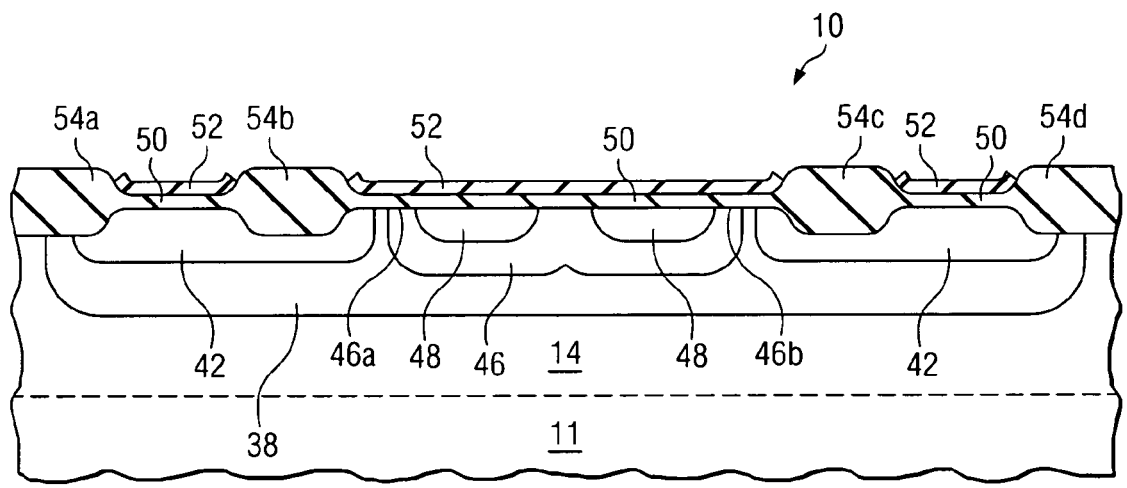

As shown in FIG. 5, photoresist layer 26$_1$ is then removed and field oxide regions 54a-54d are thermally grown in exposed locations 26d-26g resulting in the structure of LDMOS transistor 10 illustrated in FIG. 5. In a particular embodiment, field oxide regions 54a and 54d have thicknesses of about 7600 Angstroms. Field oxide regions 54b and 54c are less thick than field oxide regions 54a and 54d due to the fact that the openings in nitride layer 52 exposing areas 26e and 26f of FIG. 5 are narrower in width than the openings exposing areas 26d and 26g of FIG. 4.

Figure 6:
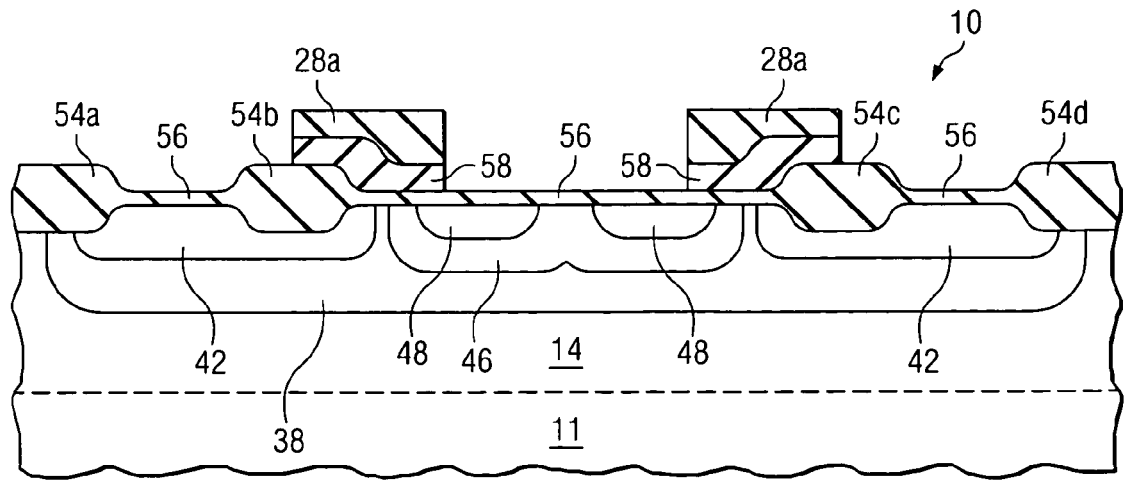

As shown in FIG. 6, pad oxide layer 50 and nitride layer 52 are then removed, for example by plasma etching. A gate oxide layer 56 is then thermally grown over the face of N-well 38 between adjacent field oxide regions 54a-54d to a thickness of about 500 Angstroms. An optional low voltage threshold adjust Vt implant may then be performed in channel regions 46a. A polysilicon layer 58 with a thickness of about 4500 Angstroms, for example, is then deposited over gate oxide layer 56 and field oxide regions 54a-54d and doped with an impurity, such as phosphorus, to render it conductive. A layer of photoresist 28a is deposited over polysilicon layer 58 and patterned and etched using a gate mask. Polysilicon layer 58 is then etched using photoresist layer 28a as a mask to form annular gate 58 resulting in the structure of LDMOS transistor 10 illustrated in FIG. 6. Gate 58 extends up onto field regions 54b and 54c.

Figure 7:
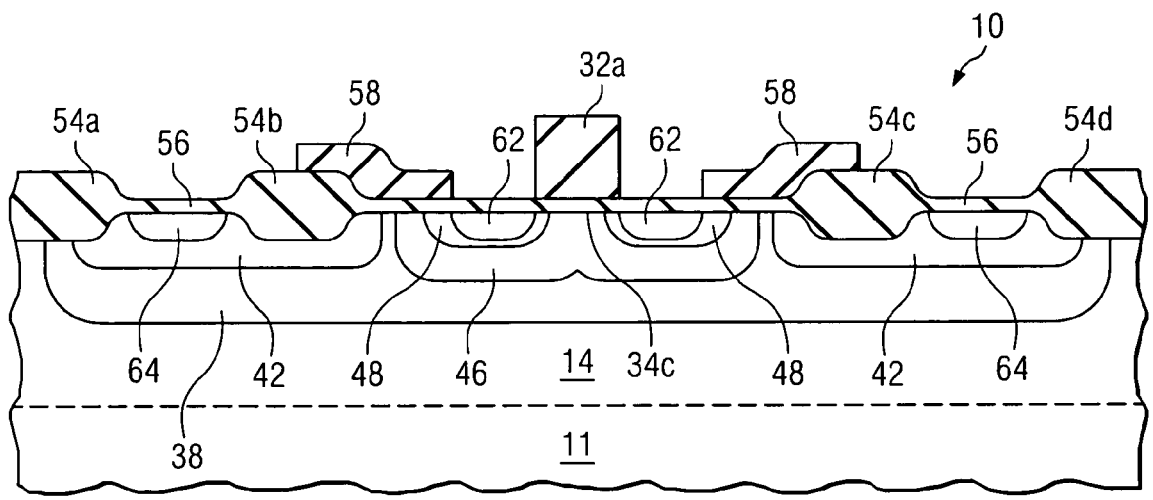

As shown in FIG. 7, photoresist layer 28a is then removed. A layer of photoresist 32a is formed over the device and patterned and etched using a n+ drain/source contact mask to block region 34c while exposing the remainder of the transistor. An implant of an n type impurity, such as phosphorus with a dose of about 4.0E14 atoms/cm$^2$ at an energy of about 80 KeV followed by arsenic with a dose of about 5.0E15 atoms/cm$^2$ at an energy of about 120 KeV, for example, is then performed to form n+ source contact regions 62 and n+ drain regions 64 resulting in the structure of LDMOS transistor 10 illustrated in FIG. 7. N+ source contact regions 62 are formed in source regions 48. N+ drain regions 64 are formed in low voltage N-wells 42.

Figure 8:
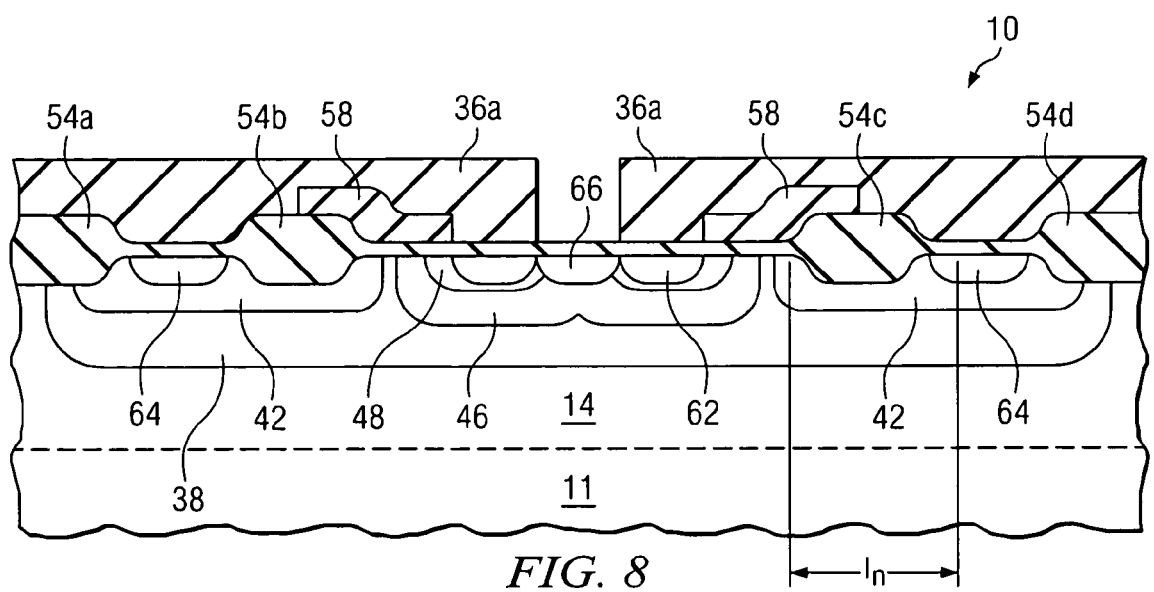

As shown in FIG. 8, photoresist layer 32a is then removed and n+ source contact regions 62 and n+ drain regions 64 annealed. A layer of photoresist 36a is then formed over the device and patterned and etched using a p+ backgate contact mask to expose region 34c. A p type dopant, for example boron with a dose of about 2.0E15 atoms cm$^2$ at an energy of about 25 KeV, is then implanted in region 34c to form p+ backgate contact regions 66, resulting in the structure of LDMOS transistor 10 illustrated in FIG. 8. At this point in the process, n+ source contact region 62 is continuous in areas between p+ backgate contact regions 66. The use of a windowed n+ source contact region 62 with a plurality of p+ backgate contact regions 66 extending through windows in n+ source contact region 62 provides efficient contact to both the P-well 46 backgate and the n source regions 48 permitting a reduction in the distance between gates 58 to conserve area.

Photoresist layer 36a is then removed and backgate contact regions 66 annealed. Contact openings are etched and metal contacts (not shown) are formed using conventional techniques to contact annular n+ source contact regions 62, n+ drain regions 64, and p+ backgate contact regions 66. P+ backgate contact regions 66 and n+ source contact regions 62 may be tied together by a single metal contact (not shown) in typical power IC applications.

As is the case for MOS devices in general, the conductivity types of the structures described above with reference to FIGS. 1-8 may be reversed. In general, reference can be made to a first conductivity type and second conductivity type, which may be n-type and p-type respectively, or p-type and n-type respectively.

Figure 9:
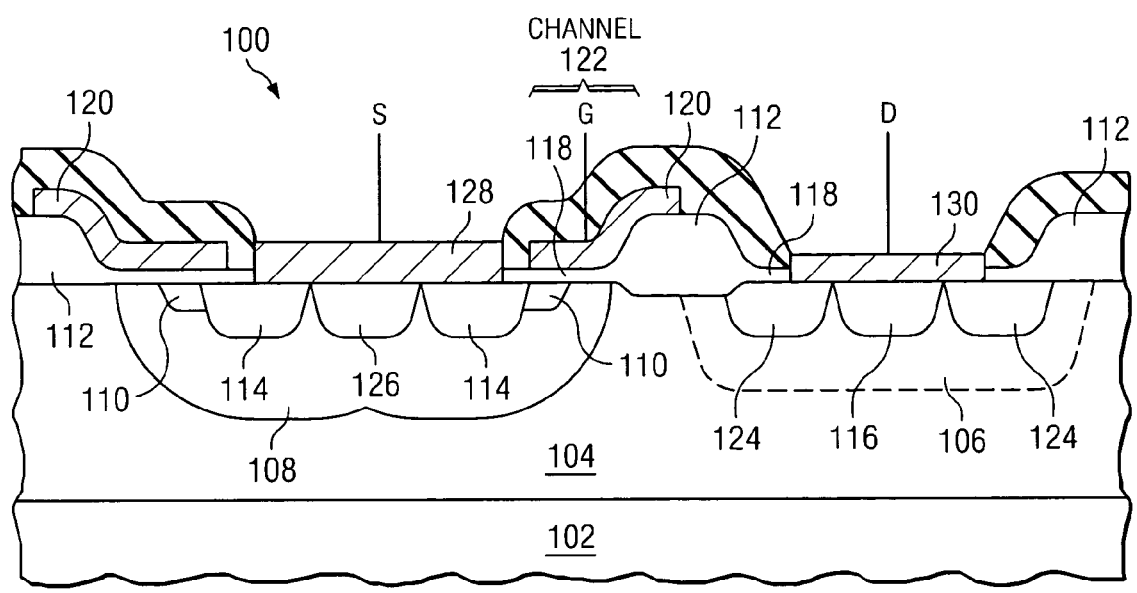
FIG. 9 illustrates a cross-section of a SCR-LDMOS transistor.

FIG. 9 illustrates a cross-section of a SCR-LDMOS transistor 100. The SCR-LDMOS transistor 100 is fabricated on a silicon substrate 102 of a first conductivity type. In the particular embodiment illustrated in FIG. 9, the first conductivity type of substrate 102 is p type, as is typical for LDMOS devices. However, as is the case for the LDMOS devices described above with reference to FIGS. 1-8, the use of p and n type semiconductor regions may be reversed. In general, reference can be made to a p type semiconductor region as having a first conductivity and an n type semiconductor region as having a second conductivity, or vice versa.

Then, a deep n-well 104 of a second conductivity type is diffused on substrate 102. As is the case with conventional LDMOS transistors, the device 100 is fabricated inside this n-well 104. The n-well 104 is a high voltage, low concentration, deep diffusion well that isolates the devices that may be formed on the same semiconductor wafer.

In the particular embodiment illustrated in FIG. 2, a shallow n-well 106 is then formed as the basis for a low resistance drain region. In alternative embodiment, SCR-LDMOS transistor 100 may not include N-well 106 because this structure is optional.

A p type and n type dopant are diffused at the same time to create a double-diffused well (P-well) having two regions, 108 and 110, which form the basis of the source and channel for each SCR-LDMOS transistor 100. As stated in the background, a characteristic of an LDMOS is that its channel is formed as the difference in lateral diffusions of co-implanted regions 108 and 110.

A ring-shaped thick field oxide region 112 separates a source 114 and drain 116 of each SCR-LDMOS transistor 100. A thin gate oxide region 118 is grown, and a polysilicon gate region 120 is deposited and etched.

Next, n+ regions are patterned and implanted to form source regions 114 and drain region 116. Regions 114 and 116 may be shaped like a ring or may form long rows. However, their relationship is best illustrated in FIG. 9, which shows a channel region 122 that separates them as well as the placement of source region 114 in the D-well formed by regions 108 and 110.

A p+ region 124 that is patterned and formed near drain region 116, between channel region 122 and the drain region 116. P+ region 124 is not found in a conventional non-planar LDMOS transistor, as shown in FIGS. 1-8. P+ region 124 provides an SCR anode and is also referred to herein as anode region 124. If n-well 106 has been provided, p+ region 124 is in n-well 106. In a particular embodiment, p+ region 124 is patterned as a ring that surrounds the drain region 116.

However, in alternative embodiments, p+ region 124 might be formed only on the channel side of drain region 116. Furthermore, although forming p+ region 124 so that it touches drain region 116 facilitates shorting their contacts, p+ region 124 could be spaced from drain region 116. For fabrication convenience, the p+ region 124 may be self-aligned to the field oxide regions 112.

A p+ backgate region 126 is formed within the source region 114. It may be patterned and formed at the same time as p+ region 124.

In the source region 114, contact regions 128 overlay and short together the n+ regions of sources 114 and the p+ regions of backgates 126. Similarly, in the drain region 116, contact regions 130 overlay and short the n+ regions of drains 116 and the p+ regions 124. As illustrated in FIG. 9, contact regions 128 and 130 are openings that receive metalization for source and drain contacts.

In this manner, SCR-LDMOS transistor 100 may be fabricated as a modification of an LDMOS device, to which p+ 124 is added to act as an SCR anode. The LDMOS source 114 acts as an SCR cathode. Apart from p+ ring 124 and contact regions 128 and 130, the fabrication of SCR-LDMOS transistor 100 may be the same as described above for LDMOS 10. The formation of p+ ring 124 may implemented as simply as modifying the pattern used for p+ backgates 126. Contacting regions 128 and 130 are formed by conventional means for providing openings for subsequent metal contact layers.

Figure 10:
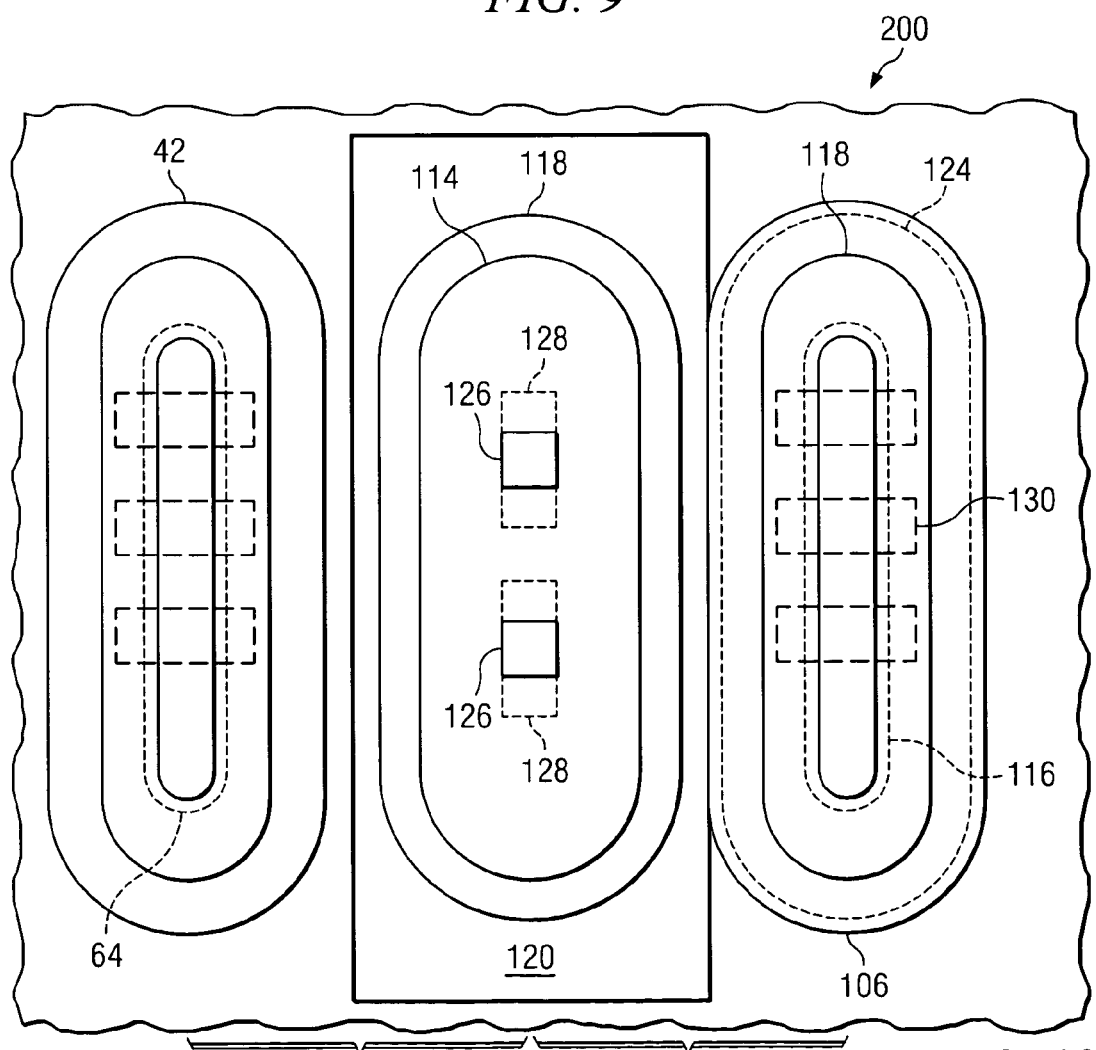
FIG. 10 illustrates a layout of a semiconductor device including LDMOS transistors and SCR-LDMOS transistors.

FIG. 10 illustrates a layout of a semiconductor device 200 including LDMOS transistors 10 and SCR-LDMOS transistors 100. Unlike prior devices which included either LDMOS transistors 10 or SCR-LDMOS transistors 100, semiconductor device 200 includes both LDMOS transistors 10 or SCR-LDMOS transistors 100. As a result, the device size does not have to be increased significantly to obtain self-protecting capability against ESD. In a particular embodiment, 90-95% of the switches in semiconductor device 200 are LDMOS transistors 10, and 5-10% of the switches are SCR-LDMOS transistors 100.

In the particular embodiment illustrate din FIG. 10, LDMOS transistors 10 and SCR-LDMOS transistors 100 share the same source regions 114, p+ backgate region 126, and contact regions 128. These reference number correspond to the reference number used in FIG. 9, but in the particular embodiment, the structures may be the same as the structures in LDMOS transistors 10 described with reference to FIGS. 1-8. As shown in FIG. 10, LDMOS transistors 10 include N-wells 42 and n+ drain regions 64, which are described above with reference to the cross-sections of LDMOS transistor 10 illustrated in FIGS. 1-8. SCR-LDMOS transistors 100 also include N-well 106 and drain region 116, which are described above with reference to the cross-section of SCR-LDMOS transistor 100 illustrated in FIG. 9. Unlike LDMOS transistors 10, SCR-LDMOS transistors also include p+ SCR anode 124, which is also described above with reference to the cross section of SCR-LDMOS transistor 100 illustrated in FIG. 9.

To achieve this integrated solution, SCR-LDMOS transistors 100 may have a smaller drift region spacing compared to LDMOS transistors 10. In LDMOS transistor 10, the drift region is the space between P-well backgate/channel region 46 and n+ drain regions 64. In SCR-LDMOS, the drift region is the space between p well 108 and p+ SCR anode region 124. In a particular embodiment, the drift region in SCR-LDMOS transistors 100 is about 10-20% smaller than the drift region is LDMOS transistors 10. This smaller drift region reduces the lag in the turn on of SCR-LDMOS transistors 100 so that the voltage across the SCR-LDMOS transistors 100 will collapse earlier than that across LDMOS transistors 10. This layout facilitates a self-protecting switch with no significant increase in area. In a particular embodiment, semiconductor device 200 is capable of self protecting up to 12 kV International Electrotechnical Commission (IEC) 61000-4-2.

In a particular embodiment, SCR-LDMOS transistors 100 may include n well 106 around drain regions 116 and 124 to ensures that the breakdown voltage of SCR-LDMOS transistors 100 is not too low even with a smaller drift region relative to LDMOS transistors 10. N well 106 helps prevent punch-through between p well 108 and p+ 124.

Although an embodiment of the invention and its advantages are described in detail, a person skilled in the art could make various alterations, additions, and omissions without departing from the spirit and scope of the present invention as defined by the appended claims.

What is claimed is:

1. A semiconductor device, comprising:
   one or more lateral diffusion metal oxide semiconductor (LDMOS) transistors, each LDMOS transistor comprising a LDMOS well of a first conductivity type, a LDMOS source region of a second conductivity type formed in the LDMOS well, and a LDMOS drain region of the second conductivity type separated from the LDMOS well by a LDMOS drift region of the second conductivity type; and
   one or more silicon controlled rectifier-lateral diffusion metal oxide semiconductor (SCR-LDMOS) transistors, each SCR-LDMOS transistor comprising a SCR-LDMOS well of the first conductivity type, a SCR-LDMOS source region of the second conductivity type formed in the SCR-LDMOS well, a SCR-LDMOS drain region of a second conductivity type and an anode region, wherein the anode region is between the SCR-LDMOS drain region and a SCR-LDMOS drift region,
   wherein at least one of the SCR-LDMOS transistors and at least one of the LDMOS transistors share a common well of the first conductivity type.

2. The semiconductor device of claim 1, wherein the first conductivity type is p-type and the second conductivity type is n-type.

3. The semiconductor device of claim 1, wherein the first conductivity type is n-type and the second conductivity type is p-type.

4. The semiconductor device of claim 1, wherein the LDMOS drift region is greater than the SCR-LDMOS drift region.

5. The semiconductor device of claim 1, wherein the SCR-LDMOS transistors are about 5-10% of all transistors in the semiconductor device and the LDMOS transistors are about 90-95% of the transistors in the semiconductor device.

6. The semiconductor device of claim 1, wherein the drain region and the anode region are formed in a well of the second conductivity type.

\* \* \* \* \*